(12) United States Patent
Bernardon (10) Patent No.: US 10,103,724 B2
(45) Date of Patent: Oct. 16, 2018

(54) DIMENSION REGULATION OF POWER DEVICE TO ELIMINATE HOT SPOT GENERATION

(71) Applicant: Infineon Technologies AG, Neubiberg (DE)

(72) Inventor: Derek Bernardon, Villach (AT)

(73) Assignee: Infineon Technologies AG, Neubiberg (DE)

( * ) Notice: Subject to any disclaimer, the term of this patent is extended or adjusted under 35 U.S.C. 154(b) by 360 days.

(21) Appl. No.: 15/138,091

(22) Filed: Apr. 25, 2016

(65) Prior Publication Data
US 2017/0310317 A1    Oct. 26, 2017

(51) Int. Cl.
| | |
|---|---|
| H03K 17/082 | (2006.01) |
| H01L 27/06 | (2006.01) |
| H01L 23/34 | (2006.01) |
| H01L 27/02 | (2006.01) |
| H02M 1/32 | (2007.01) |
| H01L 29/78 | (2006.01) |
| H03K 17/08 | (2006.01) |

(52) U.S. Cl.
CPC ......... *H03K 17/0822* (2013.01); *H01L 23/34* (2013.01); *H01L 27/0207* (2013.01); *H01L 27/0617* (2013.01); *H02M 1/32* (2013.01); *H01L 29/78* (2013.01); *H01L 29/7801* (2013.01); *H02M 2001/327* (2013.01); *H03K 2017/0806* (2013.01); *H03K 2217/0027* (2013.01)

(58) Field of Classification Search
CPC . H03K 17/0822; H01L 23/34; H01L 27/0207; H01L 27/0617; H01L 29/78; H02M 1/32
See application file for complete search history.

(56) References Cited

U.S. PATENT DOCUMENTS

| | | | | |
|---|---|---|---|---|
| 2010/0308872 | A1* | 12/2010 | Gillberg | H01L 21/823487 327/108 |
| 2012/0286757 | A1* | 11/2012 | Avitan | G05F 1/565 323/284 |
| 2013/0187549 | A1* | 7/2013 | Pan | H05B 37/02 315/121 |
| 2013/0200799 | A1* | 8/2013 | Pan | H05B 33/0887 315/121 |

* cited by examiner

*Primary Examiner* — Scott Bauer
(74) *Attorney, Agent, or Firm* — Shumaker & Sieffert, P.A.

(57) ABSTRACT

A parameter is compared to a lower threshold. The parameter is a gate-to-source voltage that is associated with a first transistor or a drain current that is associated with the first transistor. The first transistor is a field effect transistor, and the first transistor is a power device. If one or more of at least one supplemental transistor is coupled to the first transistor, and the parameter is less than the lower threshold, a plurality of switches is controlled to decouple at least one of the at least one supplemental transistor from the first transistor.

20 Claims, 5 Drawing Sheets

DIMENSION REGULATION OF POWER DEVICE TO ELIMINATE HOT SPOT GENERATION

TECHNICAL FIELD

This disclosure relates to power devices, and more specifically the elimination of hot spots in power devices.

BACKGROUND

A linear regulator is arranged to generate a regulated output voltage from an input voltage. A linear regulator may include a power pass element that operates like a variable resistor that is part of a voltage divider, where the variable resistance is continuously adjusted to maintain a constant output voltage. The output voltage is compared to a reference voltage to produce a control signal to the power pass element, where the control signal drives the gate or base of the power pass element.

SUMMARY

In general, the disclosure relates to a process in which a parameter is compared to a lower threshold. The parameter is a gate-to-source voltage that is associated with a first transistor or a drain current that is associated with the first transistor. The first transistor is a field effect transistor, and the first transistor is a power device. If one or more of at least one supplemental transistor is coupled to the first transistor, and the parameter is less than the lower threshold, a plurality of switches is controlled to decouple at least one of the at least one supplemental transistor from the first transistor.

In some examples, a device comprises: a first transistor, wherein the first transistor is a field effect transistor, and wherein the first transistor is a power device; at least one supplemental transistor; a plurality of switches that are arranged to selectively couple one or more of the at least one supplemental transistor to the first transistor; and a comparison circuit that is arranged to: compare a parameter to a lower threshold, wherein the parameter is at least one of a gate-to-source voltage that is associated with the first transistor or a drain current that is associated with the first transistor; and if one or more of the least one supplemental transistor is coupled to the first transistor, and the parameter is less than the lower threshold, controlling the plurality of switches to decouple at least one of the at least one supplemental transistor from the first transistor.

In some examples, a method comprises: comparing a parameter to a lower threshold, wherein the parameter is at least one of a gate-to-source voltage that is associated with a first transistor or a drain current that is associated with the first transistor, wherein the first transistor is a field effect transistor, and wherein the first transistor is a power device; and if one or more of at least one supplemental transistor is coupled to the first transistor; and the parameter is less than the lower threshold, controlling a plurality of switches to decouple at least one of the at least one supplemental transistor from the first transistor, wherein the plurality of switches are arranged to selectively couple one or more of the at least one supplemental transistor to the first transistor.

In some examples, a device comprises: means for comparing a parameter to a lower threshold, wherein the parameter is at least one of a gate-to-source voltage that is associated with a first transistor or a drain current that is associated with the first transistor, wherein the first transistor is a field effect transistor, and wherein the first transistor is a power device; means for controlling, if one or more of at least one supplemental transistor is coupled to the first transistor, and the parameter is less than the lower threshold, a plurality of switches to decouple at least one of one or more supplemental transistor from the first transistor, wherein the plurality of switches are arranged to selectively couple one or more of the at least one supplemental transistors to the first transistor.

The details of one or more examples of the disclosure are set forth in the accompanying drawings and the description below. Other features, objects, and advantages of the disclosure will be apparent from the description and drawings, and from the claims.

BRIEF DESCRIPTION OF DRAWINGS

Non-limiting and non-exhaustive examples of the present disclosure are described with reference to the following drawings.

DETAILED DESCRIPTION

Various examples of this disclosure will be described in detail with reference to the drawings, where like reference numerals represent like parts and assemblies throughout the several views. Reference to various examples does not limit the scope of this disclosure which is limited only by the scope of the claims attached hereto. Additionally, any examples set forth in this specification are not intended to be limiting and merely set forth some of the many possible examples of this disclosure.

Throughout the specification and claims, the following terms take at least the meanings explicitly associated herein, unless the context dictates otherwise. The meanings identified below do not necessarily limit the terms, but merely provide illustrative examples for the terms. The meaning of "a," "an," and "the" includes plural reference, and the meaning of "in" includes "in" and "on." The phrase "in one embodiment," or "in one example," as used herein does not necessarily refer to the same embodiment or example, although it may. Similarly, the phrase "in some embodiments," or "in some examples," as used herein, when used multiple times, does not necessarily refer to the same embodiments or examples, although it may. As used herein, the term "or" is an inclusive "or" operator, and is equivalent to the term "and/or," unless the context clearly dictates otherwise. The term "based, in part, on", "based, at least in part, on", or "based on" is not exclusive and allows for being based on additional factors not described, unless the context clearly dictates otherwise. Where suitable, the term "gate" is intended to be a generic term covering both "gate" and "base"; the term "source" is intended to be a generic term covering both "source" and "emitter"; and the term "drain" is intended to be a generic term covering both "drain" and "collector." The term "coupled" means at least either a direct electrical connection between the items connected, or an indirect connection through one or more passive or active intermediary devices. The term "signal" means at least one current, voltage, charge, temperature, data, or other signal.

Figure 1:
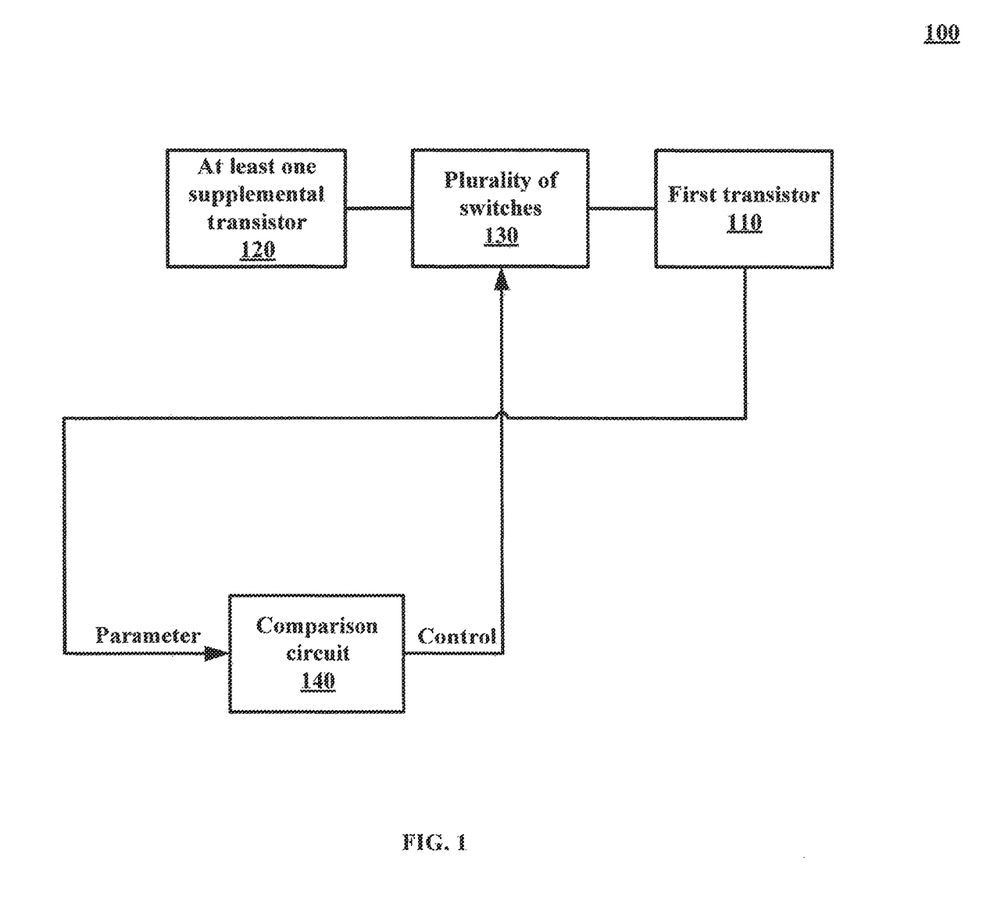
FIG. 1 is a block diagram illustrating an example of a device.

FIG. 1 is a block diagram illustrating an example of device 100. Device 100 includes first transistor 110, at least one supplemental transistor 120, plurality of switches 130, and comparison circuit 140. First transistor 110 is a field effect transistor, and first transistor 110 is a power device. Plurality of switches 130 are arranged to selectively couple one or more of the at least one supplemental transistor 120 to first transistor 110.

First transistor 110 is arranged and/or biased to operate in the linear region of operation (the linear region of operation is also known as the ohmic region of operation or the triode region of operation). Comparison circuit 140 is arranged to compare a parameter to a lower threshold. The parameter is a gate-to-source voltage that is associated with first transistor 110 or a drain current that is associated with first transistor 110. Comparison circuit 140 is further arranged such that, if one or more of the least one supplemental transistor is coupled to the first transistor, and the parameter is less than the lower threshold, comparison circuit 140 controls plurality of switches 130 to decouple at least one of the at least one supplemental transistor 120 from first transistor 110.

Further, in some examples, comparison circuit 140 is further arranged to compare the parameter to an upper threshold. In these examples, comparison circuit 140 is further arranged such that, if less than all of the at least one supplemental transistor 120 is coupled to first transistor 110, and the parameter is greater than the upper threshold, comparison circuit 140 controls plurality of switches 130 to couple at least one of at least one supplemental transistor 120 to first transistor 110.

The manner in which plurality of switches 130 selectively couples at least one supplemental transistor or at least one supplemental transistor 120 with first transistor 110 varies in different examples. In some examples, plurality of switches 130 couples one or more of at least one supplemental transistor 120 to first transistor 110 by coupling the one or more of the at least one supplemental transistor 120 in parallel with main transistor 110.

Figure 2:
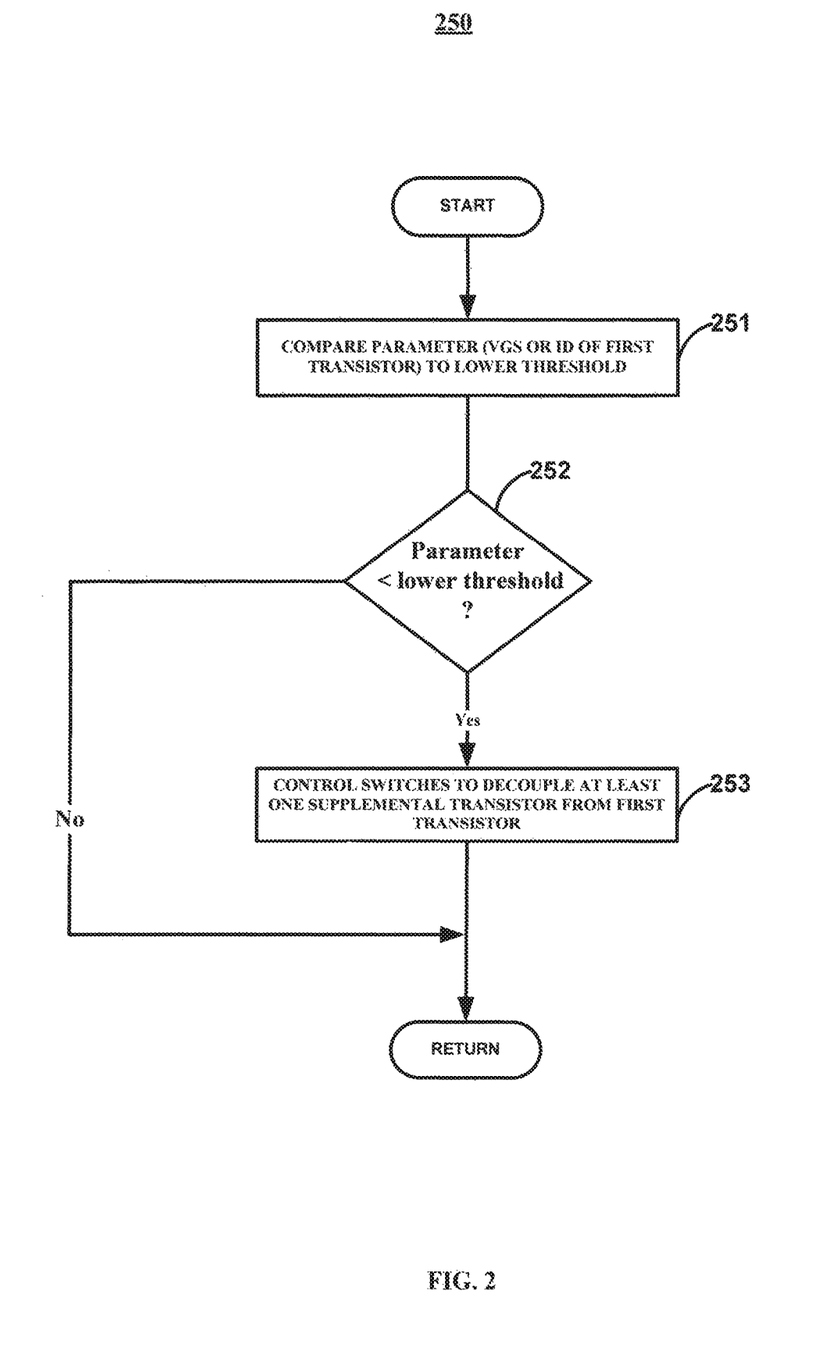
FIG. 2 is a flowchart illustrating an example of a process that may be employed by an example of the device of FIG. 1.

FIG. 2 is a flowchart illustrating an example of process 250, which may be used by an example of device 100 of FIG. 1. After a start block, a comparison circuit (e.g., comparison circuit 140 of FIG. 1) compares a parameter to a lower threshold (251). The parameter is gate-to-source voltage ($V_{GS}$) that is associated with a first transistor (e.g., first transistor 110 of FIG. 1) or a drain current ($I_D$) that is associated with the first transistor. The first transistor is a field effect transistor, and the first transistor is a power device.

Next, the comparison circuit makes a determination as to whether one or more of the least one supplemental transistors is coupled in parallel with the first transistor, and the parameter is less than the lower threshold (252). If the comparison circuit determines that one or more of the least one supplemental transistors is coupled in parallel with the first transistor, and the parameter is less than the lower threshold, then the comparison circuit controls a plurality of switches (e.g., plurality of switches 130 of FIG. 1) to decouple at least one of the at least one supplemental transistor from the first transistor (253). The plurality of switches are arranged to selectively couple one or more of the at least one supplemental transistors to the first transistor.

The process then advances to a return block, whether other processing is resumed. If at decision block 252 the determination is negative, the process moves to the return block.

Figure 3:
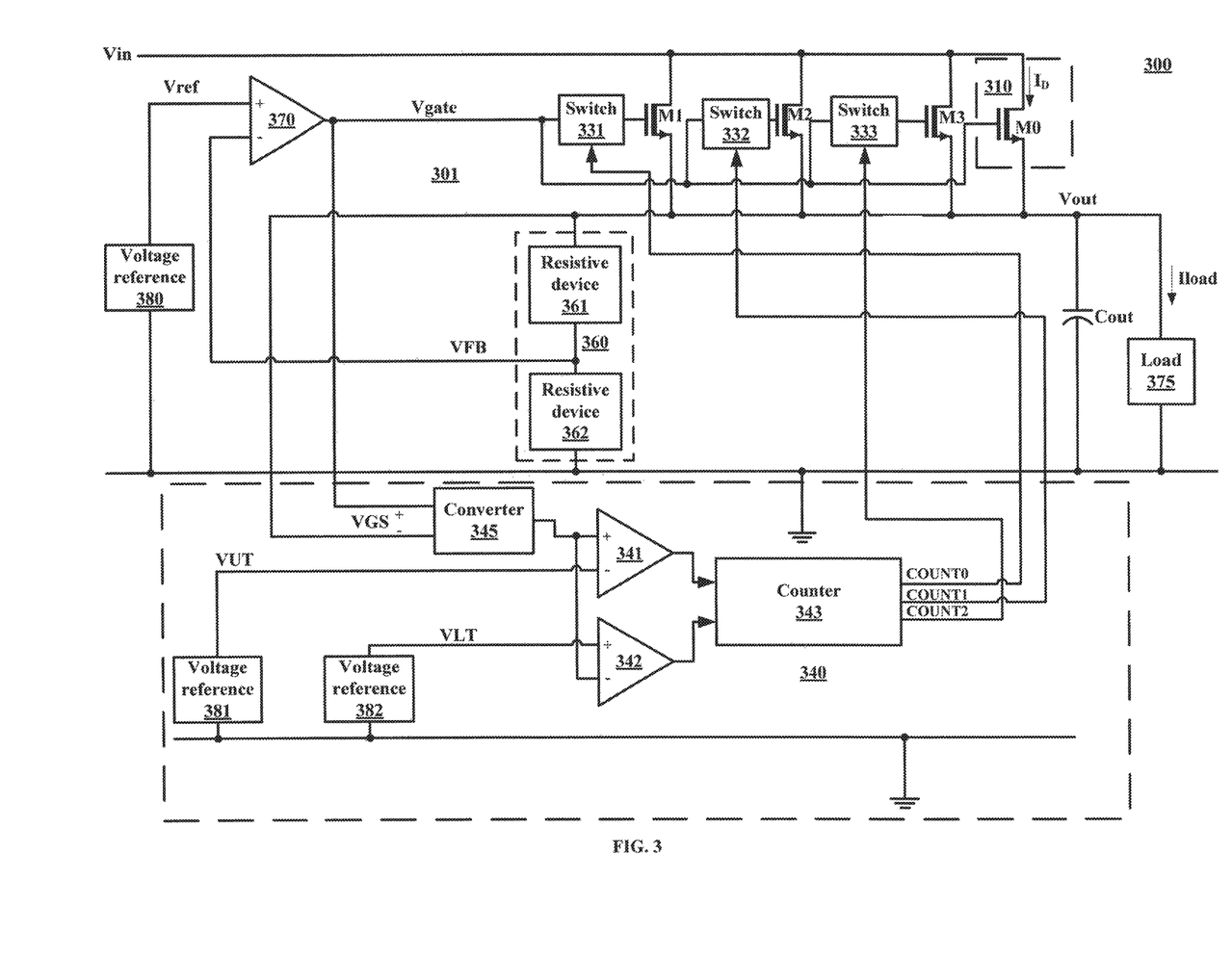
FIG. 3 is a block diagram of an example of a linear voltage regulator that includes an example of the device of FIG. 1.

FIG. 3 is a block diagram of an example of device 300, which includes linear voltage regulator 301 and load 375. Device 300 may be employed as an example of device 100 of FIG. 1. Linear regulator 301 includes first transistor 310, at least one supplemental transistor 320, plurality of switches 330, and comparison circuit 340, which are examples of main transistor 110, at least one supplemental transistor 120, plurality of switches 130, and comparison circuit 140 of FIG. 1, respectively. Linear regulator 301 may further include output capacitor Cout, voltage divider 360, error amplifier 370, and voltage reference 380. In one example, first transistor 310 includes transistor M0. At least one supplemental transistor 320 includes transistors M1-Mn (e.g., M1-M3 for three supplemental transistors). Plurality of switches 330 includes switches 331-33n (e.g., 331-333 for three switches, with one switch for each supplemental transistor M1-Mn). In one example, comparison circuit 340 includes comparators 341 and 342, counter 343, converter 345, and voltage references 381 and 382. Voltage divider 360 may include resistive device 361 and resistive device 362.

Linear regulator 301 is arranged to provide regulated output voltage Vout from input voltage Vin. Load 375 is driven by output voltage Vout. Capacitor Cout is the output capacitor for linear regulator 301. In one example, transistor M0 is arranged to operate as a power pass device for the linear regulator. Although not shown in FIG. 3, in some examples, transistor M0 is built around a temperature sensor and/or surrounds the temperature sensor. In other examples, transistor M0 is near the temperature sensor but not around the temperature sensor. Voltage divider 360 may be arranged to provide feedback voltage VFB from output voltage Vout. Voltage reference 380 may be arranged to provide reference voltage Vref. Error amplifier 370 may be arranged to effectively compare feedback voltage VFB with reference voltage Vref and to drive the gate of transistor M0 with voltage Vgate in order to provide the negative feedback for regulating output voltage Vout.

Voltage references 381 and 382 may be arranged to generate upper threshold voltage VUT and lower threshold voltage VLT, respectively. VGS is the gate-to-source voltage of first transistor 310, and VGS is an example of the parameter of device 100 of FIG. 1. Converter 345 may be arranged to convert differential voltage VGS (where differential voltage VGS is the gate-to-source voltage of transistor M0) into a single-ended voltage (e.g., referenced to ground). Comparator 341 may be arranged to compare voltage VGS with upper threshold voltage VUL, and comparator 342 may be arranged to compare voltage VGS with lower threshold voltage VLT. In some examples, counter 343 is arranged together with comparators 341 and 342 such that counter 343 has a digital count value that decrements when voltage VGS is below VLT, and increments when voltage VGS is above VUT. In one example, VLT is a temperature stable operating point of the first transistor (e.g., 1.4V) and VUT is 2.0 volts. These values are given by way of example only, and other suitable values of VLT and VUT are may be used in other examples within the scope and spirit of the disclosure.

In some examples, counter 343 is arranged to provide digital count signal COUNT0-COUNTn (e.g., COUNT0-COUNT2 for a three-bit signal, with one bit for each supplemental transistor M0-Mn) based on the digital count value of counter 343. Signal COUNT0-COUNT2 is an example of the control provided by the comparison circuit of device 140 of FIG. 1. Each signal COUNT0-COUNTn controls the opening and closing of a corresponding switch 331-33n (e.g., 331-333 for three switches, one switch for each supplemental transistor M0-Mn).

Supplemental transistors M1-Mn together with switches 331-33n are arranged to adaptively adjust the dimensioning of main transistor M0. When switch 331 is closed, transistor M1 is coupled in parallel with main transistor M0, effectively increasing the size of transistor M0. When switch 331 goes from closed to open, transistor M1 is de-coupled from transistor M0, effectively decreasing the size of transistor M0. Similarly, when switch 331 is closed, transistor M2 is coupled in parallel with main transistor M0, effectively increasing the size of transistor M0. Transistor M0 is effectively split into transistors M0-Mn where switches 331-33n may be turned on and off to selectively adjust the size of transistor M0.

As the physical size of transistor M0 is decreased, the temperature stable point (TSP) moves to lower drain currents. In some examples, linear regulator 300 does not decrease below the TSP as long as VGS is greater than or equal to about 1.4V. Linear regulator 301 measures the VGS of first transistor 310 and adapts the size of first transistor 310 in order to maintain the VGS as almost always greater than the TSP of ~1.4V. When the condition that VGS is almost always greater than 1.4V is met, then linear regulator 301 returns to an operating condition where if there is more current locally, this will heat more, which in turn will decrease the load current Iload and therefore tend to distribute the heat uniformly across the entire active area of the power device M0. Device 300 is arranged to adaptively change the size of first transistor 310 to keep device 300 always in a positive temperature stable point, by decreasing the size of first transistor 310 when the device would otherwise drop below the TSP. This may prevent the generation of hot spots on transistor M0. On the other hands, in order to achieve the thermal resistance needed with first transistor M0 and/or other devices in parallel with transistor M0 to achieve a specific output current at a specific VDS voltage, the size of transistor M0 is increased when necessary to achieve the particular thermal resistance.

In linear regulators, particularly when the power pass device is a transistor with a relatively thin gate oxide thickness, there is a risk of hot spot generation, where a hot spot is overheating on a single spot of a device that is sufficiently hot to potentially damage the device. Power dissipation can be very large in a power pass transistor of a linear regulator where the power pass transistor has a relatively thin gate oxide. In the power pass transistor, below the TSP, some current may start increasing in certain areas of the transistor where the transistor is hotter. Since the VGS is constant over the whole gate local current, in one spot the current may increase, thus causing a localized higher temperature, which in turn draws even more current, thereby generating a positive feedback reaction that locally damages the device due to overheating in a single spot of the transistor. Linear regulator 301 is arranged to prevent the generation of such a hot spot, and to do so without excessively increasing device area.

In linear regulator 301, in some examples, comparison circuit 340 is arranged to compare the VGS of power pass transistor M0 with lower threshold voltage VLT and upper threshold voltage VUT. In some examples, the lower voltage threshold is slightly greater than the TSP and the upper voltage threshold is significantly high, but not so high as to cause overheating of transistor M0.

FIG. 3 illustrates an example of device 300 in which the VGS of transistor M0 is compared to an upper threshold and a lower threshold, with the switches 331-33n opened and closed accordingly. In other examples, instead of VGS, the drain current of transistor M0 is compared with upper and lower threshold, with the count value decremented when the drain current is below the lower threshold, and the count value incremented with the drain current is above the higher threshold. These examples and others are within the scope and spirit of the disclosure.

In some examples, transistors M0-Mn are DMOSFETs. However, the disclosure is not so limited, and in various examples, transistors M0-Mn may be MOSFETs, NMOSFETs, PMOSFETs, or the like. Also, although FIG. 3 literally shows an example in which n=3, in some examples, n may be some other value such 6, 7, 8, or 9, and in various examples, n may be any suitable value. These examples and others are within the scope and spirit of the disclosure. Also, in some examples, counter 343 includes an oscillator, and in other examples, counter 343 does not include an oscillator.

Figure 4:
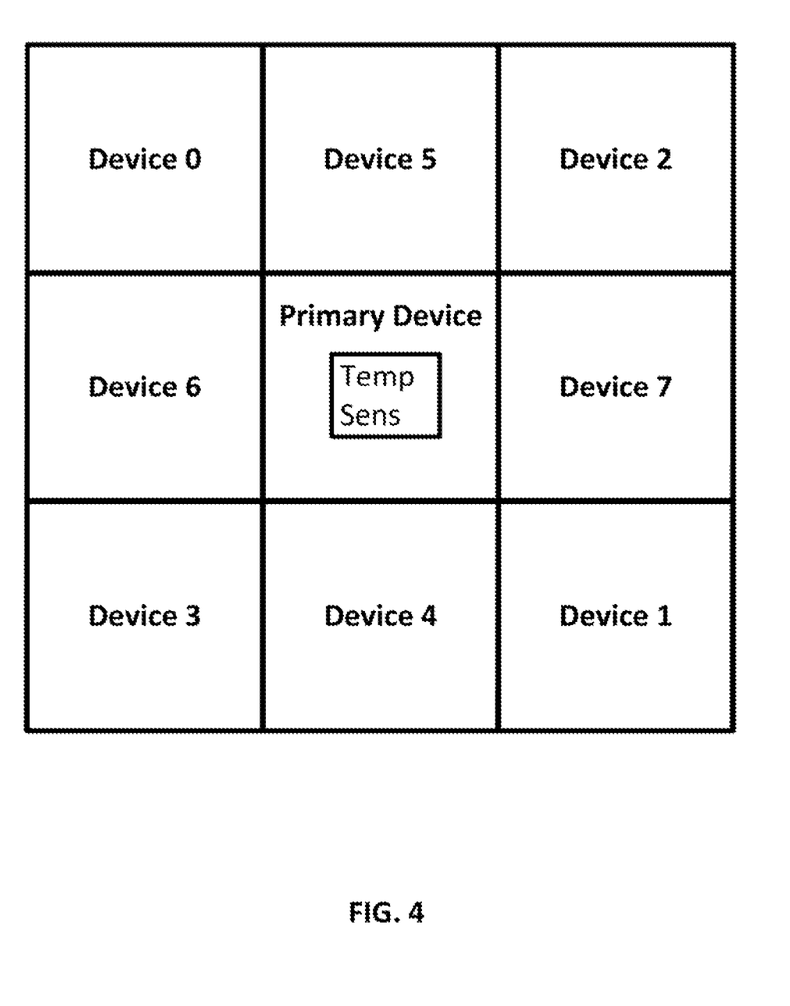
FIG. 4 is a block diagram illustrating a layout of an example of the linear voltage regulator of FIG. 3.

FIG. 4 is a block diagram illustrating a layout of an example of the linear regulator of FIG. 3.

In some examples, the primary device, such as the first transistor (e.g., transistor M0 of FIG. 3) VGS voltages are almost always operating at values greater than the TSP of Except for when the device current falls below ~30 mA, the VGS voltage remains above the TSP. However, to ensure that no hotspots damage the primary power device, examples of the primary device (e.g., the first transistor) are built around a temperature sensor as shown in FIG. 4. In such a case when the load currents are below the TSP but the VDS voltage is very high, hot spots could be generated. However, in some examples, if the primary device is built around the temperature sensor, then any hotspot will be detected and cause a shutdown of the device, thereby protecting the primary device from damage due to overheating.

Once the primary device has reached its TSP, transistor M0 may start distributing uniformly the heat across the active device M0. In some examples, as the other devices (e.g., the at least one supplemental transistor, such as transistors M1-Mn of FIG. 3) are turned ON, the supplemental transistors will also follow in distributing their heat uniformly across the new active area, thereby having no risk of generating hotspots, and accordingly do not require a separate temperature sensor, because the temperature of each supplemental transistor will be very close to that of the primary device.

While FIG. 3 shows an example of linear regulator in which the first transistor 310 is the power pass transistor, the disclosure is not so limited, and other examples are within the scope and spirit of the disclosure. One example of a linear regulator in which the first transistor is a different device that the power pass transistor is discussed below with regard to FIG. 5.

Figure 5:
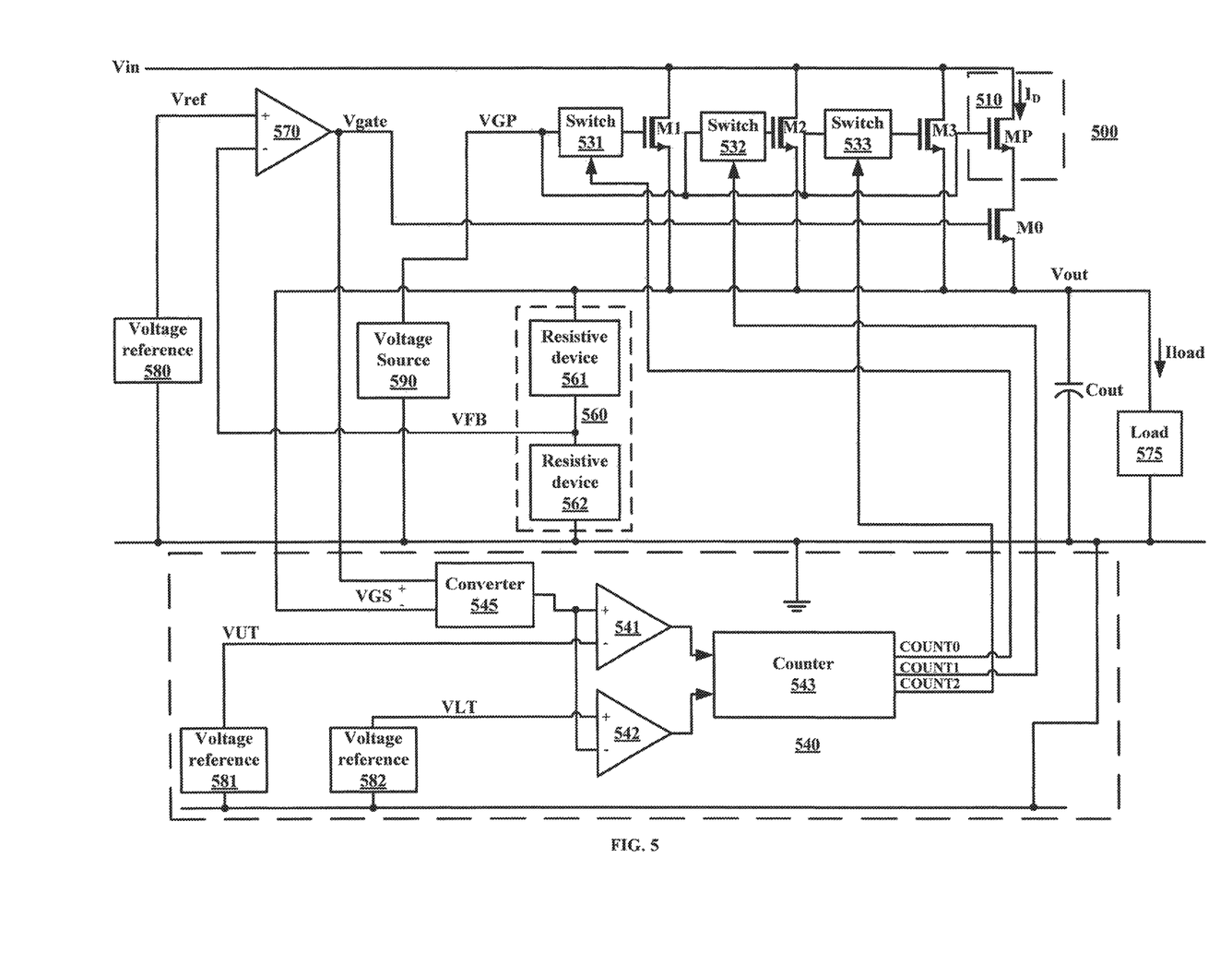
FIG. 5 is block diagram illustrating an example of the linear voltage regulator of FIG. 3, arranged in accordance with aspects of the disclosure.

FIG. 5 is block diagram illustrating an example of device 500, which may be employed as an example of device 300 of FIG. 3. Device 500 operates in a similar manner as device 300, except as follows. Device 500 further includes transistor MP and voltage source 590. In device 500, it is transistor MP, rather than power pass transistor M0, that is an example of first transistor 510. Voltage source 590 is arranged to provide voltage VGP Transistor MP is arranged to operate as a pre-regulator. Transistor MP has a drain that is coupled to input voltage Vin, a gate that is coupled to voltage VGP, and a source that is coupled to the drain of main transistor M0. Transistor MP is coupled in series with transistor M0.

Instead of being arranged to selectively couple supplemental transistor M1-Mn in parallel with power pass transistor M0, switches 531-53n and supplemental transistor M1-Mn are arranged to be selectively coupled in parallel with pre-regulator transistor MP, as illustrated in FIG. 5.

In some examples, voltage source 590 is a Zener diode that is coupled to ground. However, the disclosure is not so limited, and other examples of voltage source 590 may be used within the scope and spirit of the disclosure.

While some examples of device 100/300/500 discussed above have been in the context of a linear voltage regulator, the disclosure is not limited to linear voltage regulators. Any suitable application in which first transistor 110 is operating in the linear region of operation may be employed, including applications such as pre-regulators, op amps, drivers, amplifiers, and/or the like.

Some examples of the disclosure are described below.

Example 1

A device comprising: a first transistor, wherein the first transistor is a field effect transistor, and wherein the first transistor is a power device; at least one supplemental transistor; a plurality of switches that are arranged to selectively couple one or more of the at least one supplemental transistor to the first transistor; and a comparison circuit that is arranged to: compare a parameter to a lower threshold, wherein the parameter is at least one of a gate-to-source voltage that is associated with the first transistor or a drain current that is associated with the first transistor; and if one or more of the least one supplemental transistor is coupled to the first transistor, and the parameter is less than the lower threshold, controlling the plurality of switches to decouple at least one of the at least one supplemental transistor from the first transistor.

Example 2

The device of example 1, wherein the plurality of switches are arranged to selectively couple one or more of the at least one supplemental transistor in parallel with the first transistor.

Example 3

The device of any combination of examples 1-2, wherein the parameter is the gate-to-source voltage that is associated with the first transistor, and wherein the lower threshold is approximately a temperature stable operating point of the first transistor.

Example 4

The device of any combination of examples 1-3, wherein the comparison circuit is further arranged to: compare the parameter to an upper threshold; and if less than all of the least one supplemental transistor is coupled in parallel with the first transistor, and the parameter is greater than the upper threshold, control the plurality of switches to couple at least one of the at least one supplemental transistor to the first transistor.

Example 5

The device of any combination of examples 1-4, wherein the first transistor is at least one of a DMOSFET, a PMOSFET, or an NMOSFET.

Example 6

The device of any combination of examples 1-5, further comprising a temperature sensor, wherein the first transistor surrounds the temperature sensor, and wherein the first transistor and the plurality of at least one supplemental transistor are laid out as a grid in which the first transistor is substantially in the center of the grid, and each supplemental transistor of the at least one supplemental transistor is arranged near the first transistor in the grid.

Example 7

The device of any combination of examples 1-6, wherein the first transistor is arranged to operate in a linear region of operation, and wherein the device is a least one of a linear regulator, a pre-regulator, an op amp, a driver, or an amplifier.

Example 8

The device of any combination of examples 1-7, wherein the first transistor is arranged to operate as a power pass element of a linear voltage regulator.

Example 9

The device of any combination of examples 1-8, wherein the first transistor is arranged to operate as a pre-regulator transistor that is coupled in series with a power pass element of a linear voltage regulator.

Example 10

The device of any combination of examples 1-9, wherein the comparison circuit is further arranged to: compare the parameter to an upper threshold; and if less than all of the least one supplemental transistor is coupled in parallel with the first transistor, and the parameter is greater than the upper threshold, control the plurality of switches to couple at least one of the at least one supplemental transistor in parallel with the first transistor.

Example 11

The device of example 10, wherein the comparison circuit includes a counter that is arranged to control the plurality of switches based on a digital count value, wherein the comparison circuit is arranged such that the digital count value is decremented when the parameter is less than the lower threshold, and such that the digital count value is incremented when the parameter is greater than the upper threshold.

Example 12

The device of example 11, wherein the comparison circuit further includes a first comparator and a second comparator, wherein the first comparator is arranged to compare the parameter with the upper threshold, the first comparator is arranged to provide a first comparator output to the counter such that the first comparator output is asserted when the parameter exceeds the upper threshold, the second comparator is arranged to provide a second comparator output to the counter such that the second comparator output is asserted when the parameter is less than the lower threshold.

Example 13

A method, comprising: comparing a parameter to a lower threshold, wherein the parameter is at least one of a gate-to-source voltage that is associated with a first transistor or a drain current that is associated with the first transistor, wherein the first transistor is a field effect transistor, and wherein the first transistor is a power device; and if one or more of at least one supplemental transistor is coupled to the first transistor, and the parameter is less than the lower threshold, controlling a plurality of switches to decouple at least one of the at least one supplemental transistor from the first transistor, wherein the plurality of switches are arranged to selectively couple one or more of the at least one supplemental transistor to the first transistor.

Example 14

The method of example 13, wherein the parameter is the gate-to-source voltage that is associated with the first transistor, and wherein the lower threshold is approximately a temperature stable operating point of the first transistor.

Example 15

The method of any combination of examples 13-14, further comprising: comparing the parameter to an upper threshold; and if less than all of the least one supplemental transistor is coupled in parallel with the first transistor, and the parameter is greater than the upper threshold, controlling the plurality of switches to couple at least one of the at leak one supplemental transistor to the first transistor.

Example 16

The method of example 15, wherein controlling the plurality of switches to decouple at least one of the at leak one supplemental transistor from the first transistor includes controlling the plurality of switches based on a digital count value, and decrementing the digital count value when the parameter is less than the lower threshold, and wherein controlling the plurality of switches to couple at least one of the at least one supplemental transistor to the first transistor includes incrementing the digital count value when the parameter is greater than the upper threshold.

Example 17

A device, comprising: means for comparing a parameter to a lower threshold, wherein the parameter is at least one of a gate-to-source voltage that is associated with a first transistor or a drain current that is associated with the first transistor, wherein the first transistor is a field effect transistor, and wherein the first transistor is a power device; means for controlling, if one or more of at least one supplemental transistor is coupled to the first transistor, and the parameter is less than the lower threshold, a plurality of switches to decouple at least one of one or more supplemental transistor from the first transistor, wherein the plurality of switches are arranged to selectively couple one or more of the at least one supplemental transistors to the first transistor.

Example 18

The device of example 17, wherein the parameter is the gate-to-source voltage that is associated with the first transistor, and wherein the lower threshold is approximately a temperature stable operating point of the first transistor.

Example 19

The device of any combination of examples 17-18, further comprising: means for comparing the parameter to an upper threshold; and means for controlling, if less than all of the least one supplemental transistor is coupled in parallel with the first transistor, and the parameter is greater than the upper threshold, the plurality of switches to couple at least one of the at least one supplemental transistor to the first transistor.

Example 20

The device of example 19, wherein the means for controlling the plurality of switches to decouple at least one of the at least one supplemental transistor from the first transistor includes means for controlling the plurality of switches based on a digital count value, and means for decrementing the digital count value when the parameter is less than the lower threshold, and wherein the means for controlling the plurality of switches to couple at least one of the at leak one supplemental transistors to the first transistor includes means for incrementing the digital count value when the parameter is greater than the upper threshold.

Various examples have been described. These and other examples are within the scope of the following claims.

What is claimed is:

1. A device, comprising:
   a first transistor, wherein the first transistor is a field effect transistor, and wherein the first transistor is a power device;
   at least one supplemental transistor;
   a plurality of switches that are arranged to selectively couple one or more of the at least one supplemental transistor to the first transistor; and
   a comparison circuit that is arranged to:
      compare a parameter to a lower threshold, wherein the parameter is at least one of a gate-to-source voltage that is associated with the first transistor or a drain current that is associated with the first transistor; and
      if one or more of the least one supplemental transistor is coupled to the first transistor, and the parameter is less than the lower threshold, controlling the plurality of switches to decouple at least one of the at least one supplemental transistor from the first transistor.

2. The device of claim 1, wherein the plurality of switches are arranged to selectively couple one or more of the at least one supplemental transistor in parallel with the first transistor.

3. The device of claim 1, wherein the parameter is the gate-to-source voltage that is associated with the first transistor, and wherein the lower threshold is approximately a temperature stable operating point of the first transistor.

4. The device of claim 1, wherein
   the comparison circuit is further arranged to:
      compare the parameter to an upper threshold; and
      if less than all of the least one supplemental transistor is coupled in parallel with the first transistor, and the parameter is greater than the upper threshold, control the plurality of switches to couple at least one of the at least one supplemental transistor to the first transistor.

5. The device of claim 1, wherein the first transistor is at least one of a DMOSFET, a PMOSFET, or an NMOSFET.

6. The device of claim 1, further comprising a temperature sensor, wherein the first transistor surrounds the temperature sensor, and wherein the first transistor and the plurality of at least one supplemental transistor are laid out as a grid in which the first transistor is substantially in the center of the grid, and each supplemental transistor of the at least one supplemental transistor is arranged near the first transistor in the grid.

7. The device of claim 1, wherein the first transistor is arranged to operate in a linear region of operation, and wherein the device is a least one of a linear regulator, a pre-regulator, an op amp, a driver, or an amplifier.

8. The device of claim 1, wherein the first transistor is arranged to operate as a power pass element of a linear voltage regulator.

9. The device of claim 1, wherein the first transistor is arranged to operate as a pre-regulator transistor that is coupled in series with a power pass element of a linear voltage regulator.

10. The device of claim 1, wherein
the comparison circuit is further arranged to:
compare the parameter to an upper threshold; and
if less than all of the least one supplemental transistor is coupled in parallel with the first transistor, and the parameter is greater than the upper threshold, control the plurality of switches to couple at least one of the at least one supplemental transistor in parallel with the first transistor.

11. The device of claim 10, wherein the comparison circuit includes a counter that is arranged to control the plurality of switches based on a digital count value, wherein the comparison circuit is arranged such that the digital count value is decremented when the parameter is less than the lower threshold, and such that the digital count value is incremented when the parameter is greater than the upper threshold.

12. The device of claim 11, wherein the comparison circuit further includes a first comparator and a second comparator, wherein the first comparator is arranged to compare the parameter with the upper threshold, the first comparator is arranged to provide a first comparator output to the counter such that the first comparator output is asserted when the parameter exceeds the upper threshold, the second comparator is arranged to provide a second comparator output to the counter such that the second comparator output is asserted when the parameter is less than the lower threshold.

13. A method, comprising:
comparing a parameter to a lower threshold, wherein the parameter is at least one of a gate-to-source voltage that is associated with a first transistor or a drain current that is associated with the first transistor, wherein the first transistor is a field effect transistor, and wherein the first transistor is a power device; and
if one or more of at least one supplemental transistor is coupled to the first transistor, and the parameter is less than the lower threshold, controlling a plurality of switches to decouple at least one of the at least one supplemental transistor from the first transistor, wherein the plurality of switches are arranged to selectively couple one or more of the at least one supplemental transistor to the first transistor.

14. The method of claim 13, wherein the parameter is the gate-to-source voltage that is associated with the first transistor, and wherein the lower threshold is approximately a temperature stable operating point of the first transistor.

15. The method of claim 13, further comprising:
comparing the parameter to an upper threshold; and
if less than all of the least one supplemental transistor is coupled in parallel with the first transistor, and the parameter is greater than the upper threshold, controlling the plurality of switches to couple at least one of the at least one supplemental transistor to the first transistor.

16. The method of claim 15, wherein controlling the plurality of switches to decouple at least one of the at least one supplemental transistor from the first transistor includes controlling the plurality of switches based on a digital count value, and decrementing the digital count value when the parameter is less than the lower threshold, and wherein controlling the plurality of switches to couple at least one of the at least one supplemental transistor to the first transistor includes incrementing the digital count value when the parameter is greater than the upper threshold.

17. A device, comprising:
means for comparing a parameter to a lower threshold, wherein the parameter is at least one of a gate-to-source voltage that is associated with a first transistor or a drain current that is associated with the first transistor, wherein the first transistor is a field effect transistor, and wherein the first transistor is a power device;
means for controlling, if one or more of at least one supplemental transistor is coupled to the first transistor, and the parameter is less than the lower threshold, a plurality of switches to decouple at least one of one or more supplemental transistor from the first transistor, wherein the plurality of switches are arranged to selectively couple one or more of the at least one supplemental transistors to the first transistor.

18. The device of claim 17, wherein the parameter is the gate-to-source voltage that is associated with the first transistor, and wherein the lower threshold is approximately a temperature stable operating point of the first transistor.

19. The device of claim 17; further comprising:
means for comparing the parameter to an upper threshold; and
means for controlling, if less than all of the least one supplemental transistor is coupled in parallel with the first transistor, and the parameter is greater than the upper threshold, the plurality of switches to couple at least one of the at least one supplemental transistor to the first transistor.

20. The device of claim 19, wherein the means for controlling the plurality of switches to decouple at least one of the at least one supplemental transistor from the first transistor includes means for controlling the plurality of switches based on a digital count value, and means for decrementing the digital count value when the parameter is less than the lower threshold, and wherein the means for controlling the plurality of switches to couple at least one of the at least one supplemental transistors to the first transistor includes means for incrementing the digital count value when the parameter is greater than the upper threshold.

* * * * *